United States Patent
Nagano et al.

(10) Patent No.: US 7,928,635 B2
(45) Date of Patent: Apr. 19, 2011

(54) PACKAGE FOR ELECTRONIC COMPONENT AND PIEZOELECTRIC RESONATOR

(75) Inventors: Yoji Nagano, Chigasaki (JP); Hideo Tanaya, Suwa (JP); Tatsuya Anzai, Hadano (JP)

(73) Assignee: Epson Toyocom Corporation, Tokyo (JP)

( * ) Notice: Subject to any disclaimer, the term of this patent is extended or adjusted under 35 U.S.C. 154(b) by 147 days.

(21) Appl. No.: 12/348,578

(22) Filed: Jan. 5, 2009

(65) Prior Publication Data
US 2009/0174291 A1 Jul. 9, 2009

(30) Foreign Application Priority Data

Jan. 7, 2008 (JP) .................................. 2008-000367
Sep. 30, 2008 (JP) .................................. 2008-252604

(51) Int. Cl.
*H01L 41/053* (2006.01)
(52) U.S. Cl. ........................................ 310/344; 310/348
(58) Field of Classification Search .................. 310/344, 310/348
See application file for complete search history.

(56) References Cited

U.S. PATENT DOCUMENTS

| 4,814,944 | A  | * | 3/1989 | Sagawa et al. | 361/767 |
| 6,998,926 | B2 | * | 2/2006 | Miyazaki et al. | 331/68 |
| 2006/0091526 | A1 | * | 5/2006 | Moriyama et al. | 257/704 |
| 2006/0162958 | A1 | * | 7/2006 | Miya et al. | 174/255 |
| 2007/0176518 | A1 | * | 8/2007 | Moriya | 310/348 |
| 2010/0060108 | A1 | * | 3/2010 | Yamada | 310/348 |

FOREIGN PATENT DOCUMENTS

| JP | A-05-308179 |   | 11/1993 |
| JP | 10-242794 | * | 9/1998 |
| JP | A-2001-308490 |   | 11/2001 |
| JP | A-2004-064701 |   | 2/2004 |
| JP | A-2005-108923 |   | 4/2005 |
| JP | 2005-191159 | * | 7/2005 |
| JP | A-2005-260600 |   | 9/2005 |
| JP | A-2006-186667 |   | 7/2006 |

* cited by examiner

*Primary Examiner* — Thomas M Dougherty
(74) *Attorney, Agent, or Firm* — Oliff & Berridge PLC

(57) ABSTRACT

A package for electronic component includes: a rectangular package body, a lid hermetically sealing the package body, an electrode pad provided in the package body, a mounting terminal provided at least near four corners of a bottom surface of the package body and having a bump on a mounting surface, and a plurality of coupling electrodes electrically coupling the pad to the mounting terminal.

7 Claims, 8 Drawing Sheets

PACKAGE FOR ELECTRONIC COMPONENT AND PIEZOELECTRIC RESONATOR

BACKGROUND

1. Technical Field

The present invention relates to a package for electronic component and a piezoelectric resonator, in particular to a package for electronic component with an improved mounting terminal structure which enhances connection strength between the package and a circuit substrate, and to a piezoelectric resonator using the package.

2. Related Art

Piezoelectric resonators, in particular surface-mount piezoelectric quartz crystal resonators, are used as a reference frequency source in a wide range of apparatuses from communication devices to household appliances because of their smallness in size and ability to produce highly precise and stable frequencies with little aging change. Recently, as these apparatuses are becoming smaller and lighter, there are growing demands for even smaller surface-mount quartz crystal resonators.

As is generally known, a surface-mount quartz crystal resonator, which includes metal films (excitation electrodes) provided on both principal surfaces of a quartz crystal plate by vacuum deposition or sputtering, is housed in a package body, and the periphery of the package body is sealed hermetically with a lid by seam welding.

When using the quartz crystal resonator in in-vehicle equipment, the connection strength between the resonator and a circuit substrate becomes particularly important. This is because in-vehicle equipment is exposed to a harsh environment of low-to-high temperatures, and, if the line expansion coefficient of the package of the piezoelectric resonator differs from that of the circuit substrate having the piezoelectric resonator, solder for connecting the package to the circuit substrate may become distorted due to recurring temperature changes and may therefore suffer fatigue breaking. Also, along with downsizing in the shape of the surface-mount quartz crystal resonator, the area of the mounting terminals of the package has also been further downsized. One example of the surface-mount quartz crystal resonator with strengthened connection between the mounting terminals (excitation electrodes) and the circuit substrate is disclosed in JP-A-2005-108923. FIG. 9A is a sectional side surface diagram of the surface-mount quartz crystal resonator, and FIG. 9B is a bottom surface diagram of the resonator. A surface-mount quartz crystal resonator 70 includes: a plane rectangular package body 71 having a recess opened at the upper part of the package body 71, a quartz crystal resonator element 75 housed in this package body 71, and a lid 72 joined to the opened part at the upper part of the package body 71. The surface-mount quartz crystal resonator 70 is connected onto a wiring pattern 91 of a circuit substrate 90 with solder 85.

Referring to the bottom diagram of FIG. 9B, a pair of terminal electrodes 82, 83, which are provided along opposing sides of the bottom surface of the package body 71, include mutually opposing regions 82a, 83a and regions 82b, 83b where only one of the electrodes is not formed. These regions are point-symmetrically disposed with respect to a central point of the package body 71. Also, castellations C1 to C4 are provided at four corners of the package body 71. The castellations C1, C3 are coupled to the terminal electrodes 82, 83, respectively. Even if a stress is generated in the terminal electrodes 82, 83 because of the thermal expansion difference between the package body 71 and the circuit substrate 90 caused by changes in the temperature environment, the package body 71 having the described structure allows this stress to interactively escape toward the corner regions 82b, 83b where one of the terminal electrodes is not formed. This produces a stress planarly rotating the package around the central point of the package body 71 and thereby reduces the stress. As a result, it is disclosed that the occurrence of problems such as solder cracking is drastically suppressed.

Also, JP-A-2006-186667 discloses a package including four terminal electrodes at four corners of the rear surface of the package, each terminal electrode having a small projection in the center. It is disclosed that, by mounting the piezoelectric resonator on a circuit substrate employing this package, gaps are generated between the terminal electrodes and the circuit substrate. It is stated that, because these gaps are filled with solder in sufficient amount and thickness, sufficient connection strength can be achieved.

However, in terms of the package body 71 disclosed in JP-A-2005-108923, the terminal electrodes 82, 83 are made conductive to the piezoelectric resonator housed in the package via the respective castellations C1, C3 provided at the corners of the package body. Therefore, if cracks occur to sections where the terminal electrodes 82, 83 are coupled to the castellations C1, C3, there is a problem that the quartz crystal resonator may not operate.

In terms of the technique of JP-A-2006-186667, although the amount of solder between a terminal electrode plane of the package and a land electrode plane of the circuit substrate may increase, it is a problem that the amount of solder is not necessarily sufficient at an area where the distortion is concentrated.

SUMMARY

An advantage of the invention is to provide a package for electronic component with enhanced connecting strength between mounting terminals and a circuit substrate and to provide a piezoelectric resonator using the package.

The present invention is intended to solve at least part of the mentioned problems and may be implemented by the following aspects of the invention.

According to a first aspect of the invention, a package for electronic component includes: a rectangular package body, a lid hermetically sealing the package body, an electrode pad provided in the package body, a mounting terminal provided at least near four corners of a bottom surface of the package body and having a bump on a mounting surface, and a plurality of coupling electrodes electrically coupling the pad to the mounting terminal.

In this case, the bump provided on the mounting surface may allow the solder to become thick at a region where large distortion is imparted. Therefore, the connection strength between the mounting terminal and the circuit substrate may increase.

It is preferable that the package for electronic component further include castellations at the four corners of the package body, the coupling electrodes being provided to the respective castellations.

The package having such a structure may not only allow conduction between a piezoelectric resonator element in the package and the mounting terminal by means of the castellations but also increase the connection strength between the package and the circuit substrate.

It is preferable that, if the mounting terminals are joined to a circuit substrate with solder, the bump on the mounting terminal have such a shape that the solder is thickened at a periphery of the four corners.

In this case, the bump provided on the mounting terminal allows the solder to be thickened at a position farthest from the center of the package to which large distortion is imparted and at the periphery of the mounting terminal excluding near the center of the package. Therefore, the connection strength between the mounting terminal and a land electrode of the circuit substrate may greatly increase.

It is preferable that the package for electronic component further include a pair of dummy electrodes provided to the package.

In this case, the distortion imparted to the mounting terminal is dispersed not only because of the connection using the mounting terminal but also because of the connection between the package and the circuit substrate using the dummy electrodes. Thus, the connection strength between the mounting terminal and the circuit substrate may increase further.

It is preferable that the package for electronic component further include more than one pair of dummy electrodes.

In this case, by use of the plurality of dummy electrodes, the connection strength between the package and circuit substrate may increase, and the distortion to the mounting terminal may be dispersed. Therefore, the connection strength between the mounting terminal and the circuit substrate may increase further.

According to a second aspect of the invention, a piezoelectric resonator includes: the package for electronic component according to the first aspect of the invention, and a piezoelectric resonator element mounted on the electrode pad of the package body.

In this case, because the connection strength between the package of the piezoelectric resonator and the circuit substrate of the electronic equipment may be great, if the piezoelectric resonator is mounted to in-vehicle electronic equipment, the equipment may be such that can endure considerable temperature changes, vibrations, and shocks.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
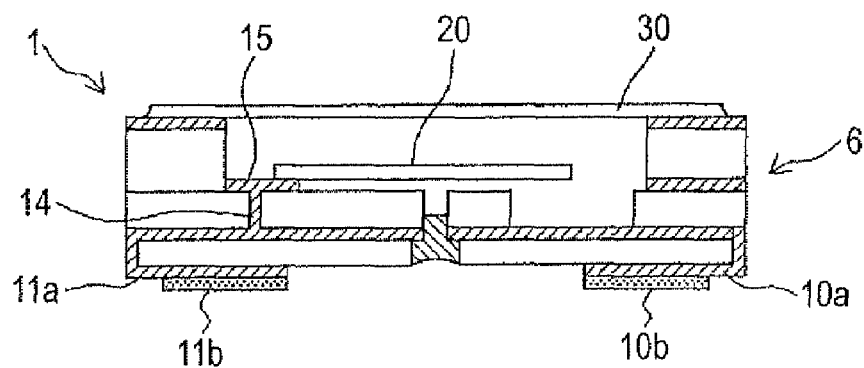
FIG. 1A is a sectional diagram schematically showing the structure of a package according to a first embodiment of the invention.
Figure 1B:
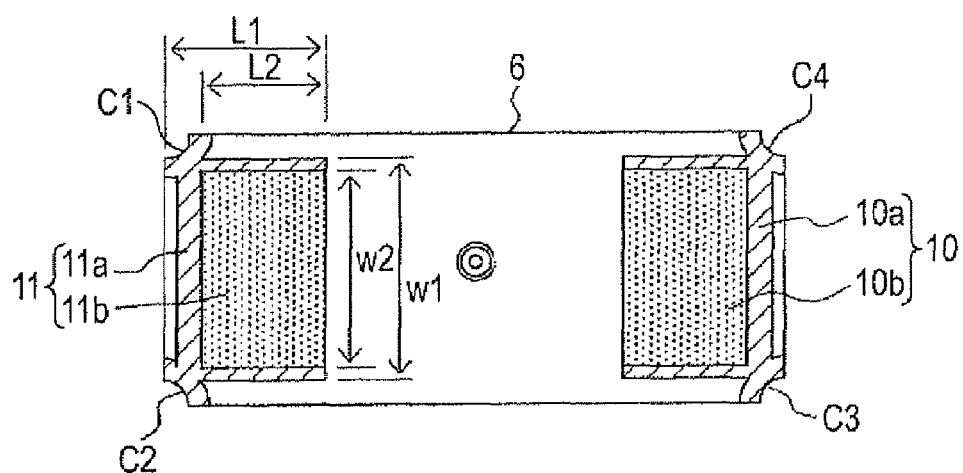
FIGS. 1B and 1C are bottom surface diagrams of FIG. 1A.

Embodiments of the invention will now be described in detail based on the drawings. FIGS. 1A and 1B are schematic diagrams showing the structure of the package for electronic component according to the first embodiment of the present invention and of the piezoelectric resonator using the package. FIG. 1A is the sectional diagram, and FIG. 1B is the bottom surface diagram. With reference to FIG. 1A, a package 1 for electronic component includes: a rectangular, laminated ceramic package body 6 which has a recess on the side adjacent to the upper surface of the package 1 and an electronic component 20 mounted in the recess, and a lid 30 which hermetically seals an aperture space on the side adjacent to the upper surface of the package body 6 having the electronic component 20. Provided in the recess on the upper surface of the package body 6 are: the electronic component 20 housed in the recess such as a pair of lead electrodes of a piezoelectric resonator element, and a pair of electrode pads 15 coupled to the electronic component 20. Provided on both sides in a width direction of the bottom surface of the package body 6 are a pair of mounting terminals (terminal electrodes) 10, 11 composed of mounting terminal bases 10a, 11a on the mounting surface and of steps (bumps) 10b, 11b. The pair of electrode pads 15 in the package body 6 are electrically coupled to the pair of mounting terminals 10, 11 by a plurality of coupling electrodes 14.

Referring to FIG. 1A, a tuning fork type quartz crystal resonator element is exemplarily used as the electronic component 20. A pair of lead electrodes (not shown) of a tuning fork type quartz crystal resonator element 20 are bonded and fixed to the pair of electrode pads 14 of the package body 6 with a conductive adhesive agent. If a metallic lid is used as the lid 30, the lid 30 is welded by e.g. resistance welding (seam welding) to a seal ring formed on the upper periphery of the package body 6, thereby hermetically sealing the package body 6. Also, with reference to FIG. 1B, castellations C1, C2, C3, C4 provided at four corners of the package body 6 are each coupled to the respective mounting terminals 10, 11 and operate also as the coupling electrodes 14. If the package 1 is mounting on the circuit substrate, the castellations C1 to C4 have an effect of increasing the connection strength between the circuit substrate and the package 1 because of fillets of the solder.

Figure 1C:
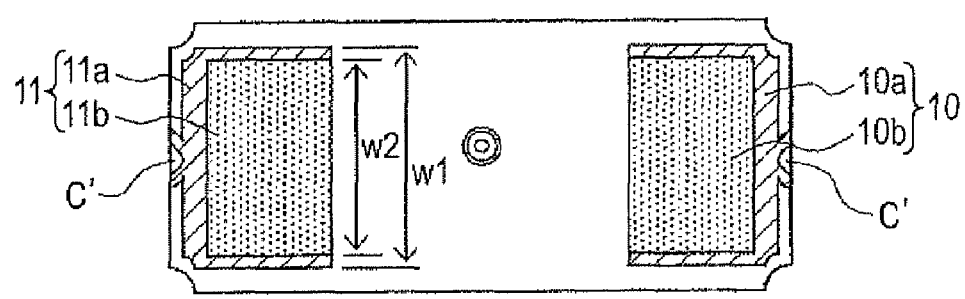

Referring to the bottom diagram of FIG. 1C, each castellation C' may be provided to each center on both sides in the width direction of the bottom surface of the package body 6.

Referring to FIG. 1B, the mounting terminals 10, 11 provided on the bottom surface of the package body 6 are each provided in the center on both sides in the width direction. The mounting terminals 10, 11 are provided by: first coating the mounting terminal bases 10a, 11a to the package body 6 using a technique such as screen printing, then applying the steps (bumps) 10b, 11b onto the surfaces of the respective mounting terminal bases 10a, 11a using a technique such as screen printing, and baking simultaneously with the package body 6. Applying one time using screen printing produces bumps having the thickness of about 10 μm to 15 μm after baking. The steps (bumps) 10b, 11b are formed in a suitable thickness accordingly. A characteristic feature of the present invention resides in the positional relationship between the mounting terminal bases 10a, 11a and the steps (bumps) 10b, 11b of the mounting terminals 10, 11. This will be explained using the mounting terminal 11 as an example. Suppose that the length and width of the mounting terminal base 11a are L1 and w1, respectively, and that the length and width of the bump 11b are L2 and w2, respectively. Then, the lengths and widths of the mounting terminal base 11a and the bump 11b are set to satisfy L1>L2 and w1>w2. Also, referring to the bottom diagram of FIG. 1B, the right end (in the drawing) of the mounting terminal base 11a is made to substantially conform to the right end of the bump 11b, and the bump 11b is located substantially at the center of the mounting terminal base 11a in the vertical direction (the width direction) in the drawing. In other words, when the mounting terminal 11 is joined to a land electrode on the side adjacent to the circuit substrate with the solder, the bump 11b is shaped such that the solder is thickened at a position farthest from the center of the package 1 for electronic component and at the periphery of the mounting terminal 11 excluding near the center of the package body 6.

The same is true with the mounting terminal base 10a and the bump 10b of the mounting terminal 10, except that the mounting terminal 11 is provided symmetrically to the mounting terminal 11 with respect to the center of the package body 6.

Figure 2:
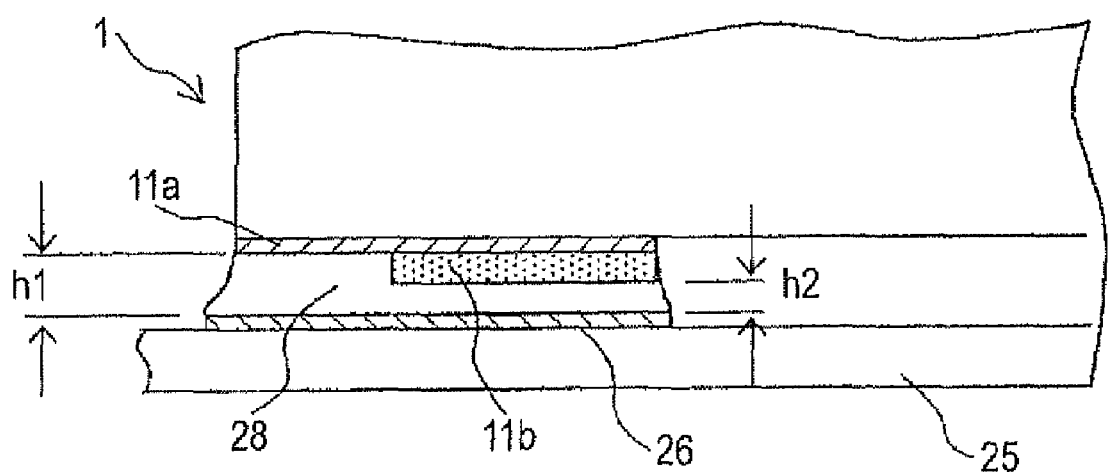
FIG. 2 is an enlarged side surface diagram of an essential part of the package as mounted to a circuit substrate.

FIG. 2 is an enlarged side surface diagram of an essential part of the mounting terminal 11, i.e. the mounting terminal base 11a and the bump 11b, in the case where the package 1 is mounted on a land electrode 26 of a circuit substrate 25. As can be seen from FIG. 2, the mounting terminal 11 of the package is composed so that a solder 28 has a thickness h1 (thickness of the solder below the mounting terminal base 11a) greater than a thickness h2 (thickness of the solder below the bump 11b). As will be described hereafter, the bump 11b is provided to the mounting terminal 11 so as to increase the amount of the solder that is most affected by the stress caused by the difference in line expansion coefficient between the circuit substrate 25 and the package 1.

Figures 3A, 3B:
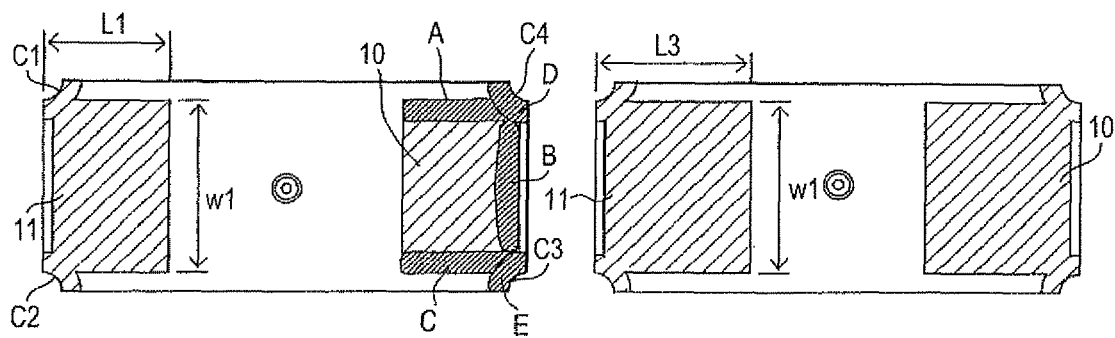
FIGS. 3A through 3D are bottom surface diagrams of respective packages.
Figures 3C, 3D:
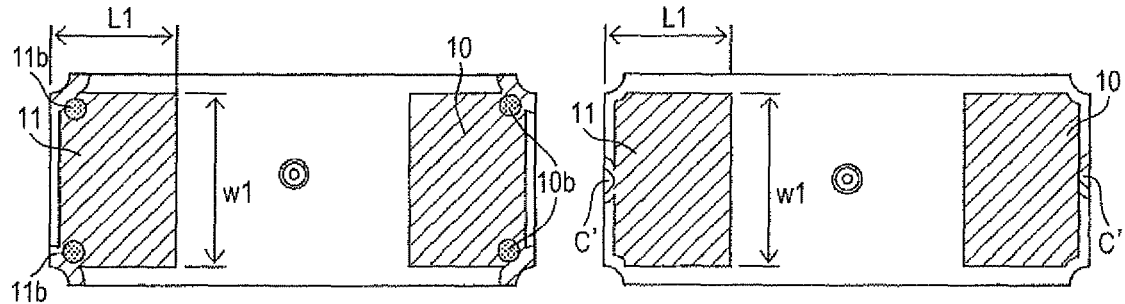

If the package is mounted to the circuit substrate, distortion is generated to a solder-joined part due to the line expansion coefficient difference between the circuit substrate and the package caused by changes in the surrounding temperature. To examine the relationship between the shape of the mounting terminal of the package and the generated distortion, four types of mounting terminals as shown in the bottom diagrams of FIGS. 3A to 3D are selected as the types of the mounting terminals of the package. FIG. 3A is a package whose mounting terminals 10, 11 have a standard area. FIG. 3B is a package whose mounting terminals have an area larger than that in FIG. 3A. FIG. 3C is a package of FIG. 3A having two steps (bumps) 10b, 11b per each mounting terminal. FIG. 3D is a package having castellations C's, one each at a central position on both sides in the width direction. When mounting each package shown in FIGS. 3A to 3D to the circuit substrate with solder, the magnitude and region of the distortion generated to the solder as a joining member were obtained from simulations. In the packages shown in FIGS. 3A, 3B, 3D, the thickness h1 of the solder at the joined part was set to at 70 μm, and, in the package shown in FIG. 3C having the bumps 10b, 11b, the thickness h1 of the solder at the joined part was set at 100 μm. The magnitude and region of the distortion generated to the solder were obtained from the simulations, in which the solidifying point of the solder (+218° C.) was assumed as the starting (stress free) point of the stress, and the loading condition under the temperature cycle condition (−40° C. ⇔+125° C.) was +218° C. to −40° C. which displays the maximum temperature change. This means that the distortion did not occur to the package and circuit substrate at the solidifying point of the solder (+218° C.) but did occur when the temperature returns to normal temperature, and the distortion was maximized at −40° C. In this case, it was assumed that the temperature variation would occur uniformly among the models, and a residual stress of the material constituting the package was not considered.

In FIG. 3A, regions overlapping with the mounting terminal on the right side of FIG. 3A are largely distorted regions upon application of the temperature cycle test of −40° C. to +125° C. It was found as a result of the simulations that the regions represented by A, B, C, D, E, particularly D and E, experienced large distortion, It is thus easily understood that the mounting terminal on the left side of FIG. 3A also has the distortion symmetrically to that on the right side. Additionally, the packages of FIGS. 3B to 3D had substantially the same largely distorted regions as those on the right side of FIG. 3A.

Figure 3E:
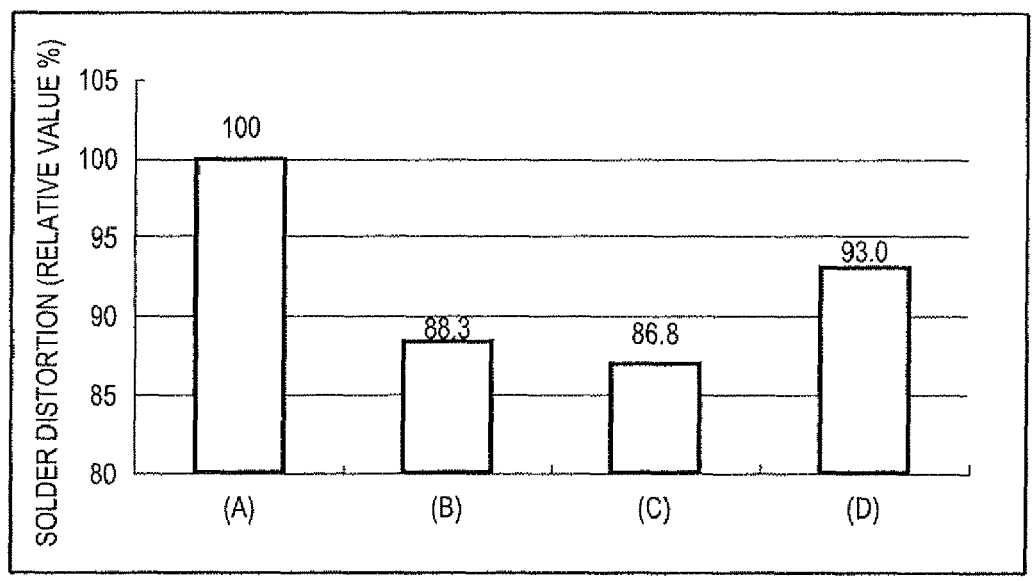
FIG. 3E is a graph showing the relationship between the shapes of mounting terminals and the relative solder distortion.

Then, the maximum distortion imparted to the castellations C1 to C4 of the mounting terminals of FIGS. 3A to 3D with respect to the shapes of the mounting terminals was acquired through the temperature cycle test of −40° C. to +125° C. FIG. 3E is a graph showing the maximum distortion imparted to the castellations of the mounting terminals of FIGS. 3B to 3D in relative values, given that the maximum distortion to the castellations of the mounting terminals of FIG. 3A was 100. In the graph, A to D on the horizontal axis represent the shapes of the mounting terminals, and the vertical axis represents the relative solder distortion. It was found from FIG. 3E that the smallest maximum distortion was generated in the castellations of the package of FIG. 3C having the mounting terminals 10, 11 provided with the bumps 10b, 11b.

This is partly because the bumps 10b, 11b provided to part of the mounting terminals allow thickening of the solder between the circuit substrate and the bottom surface of the mounting terminals and thus reduce the distortion. The relationship between the solder thickness and the connection strength is disclosed in JP-A-5-308179, in that the connection strength has its maximum value with respect to a solder thickness, and that there is a suitable thickness. Having in mind the results of the simulations, various types of packages were then produced. The produced packages have the mounting terminals that allow thickening of the solder at the periphery of each mounting terminal excluding near the center of each package. Then, a cracking ratio (a ratio of the crack length in a given section of the solder to the entire solder length) of each package was examined. The results show that the cracking ratio of the sectioned solder of the package shown in FIGS. 1A through 1C was lower, meaning that there were fewer occurrences of cracks than the solder of the package shown in FIG. 3C.

Figure 4A:
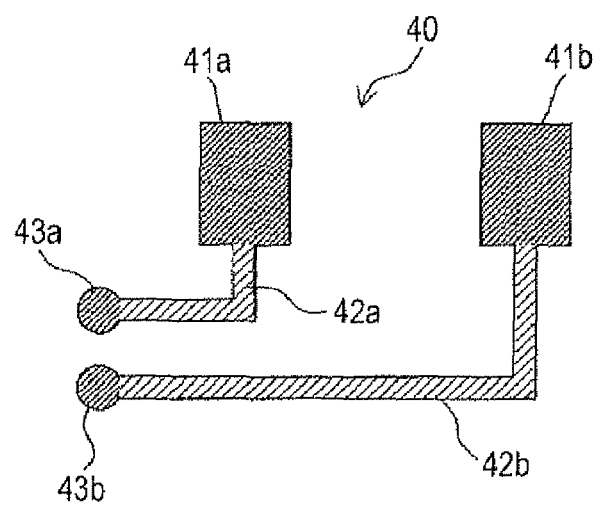
FIG. 4A is a plan diagram of a pattern for measuring conductive resistance.
Figure 4B:
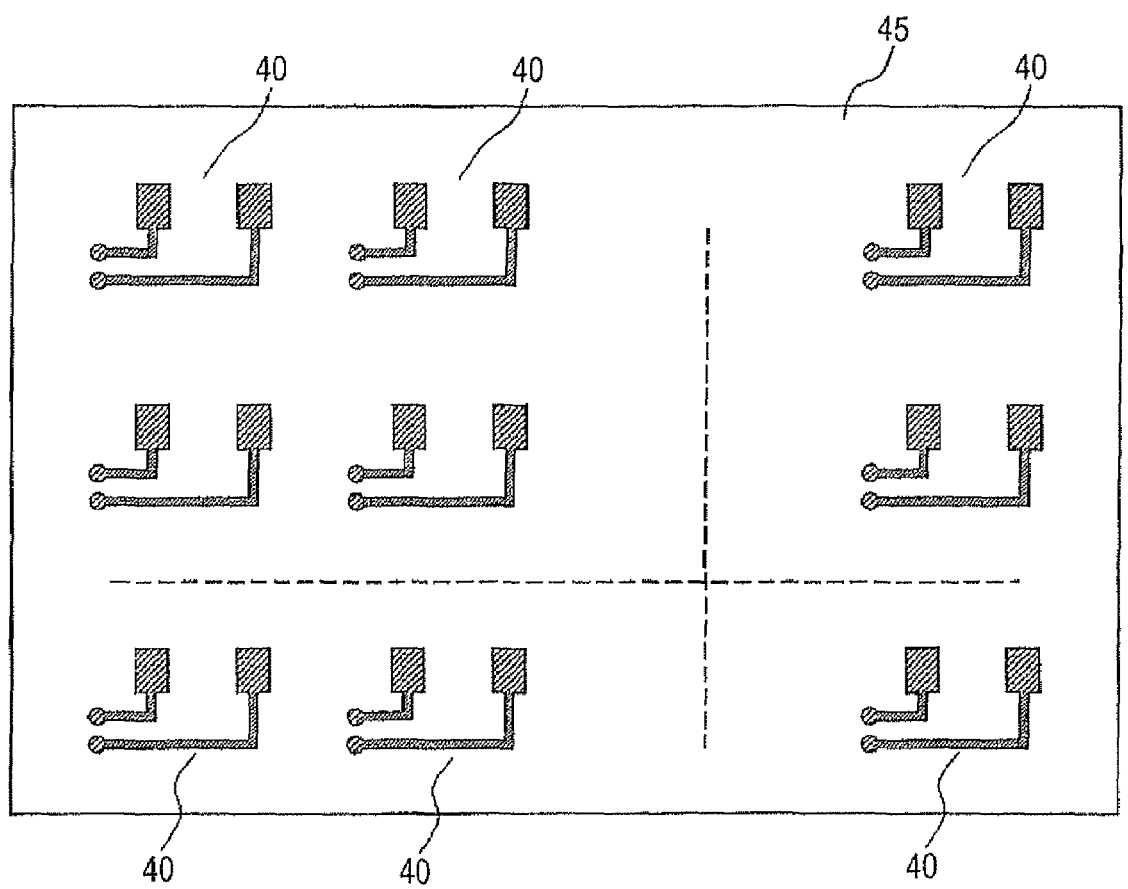
FIG. 4B is a plan diagram of the patterns of FIG. 4A arranged on the substrate.

Experiments were then conducted to find out how the conductive resistance between the land electrode and the mounting terminal varies depending on the number of temperature cycles (heat cycles) of −40° C. to +215° C., in the case where the package according to the embodiment of the invention as shown in FIGS. 1A through 1C is mounted on the mounting substrate, that is, in the case where the mounting terminals were joined to the land electrodes of the mounting substrate with the solder. FIG. 4A is a pattern 40 for measurement on the substrate with the package. 41a, 41b are land electrodes, 42a, 42b are wiring conductors, and 43a, 43b are terminal electrodes for measuring conductive resistance. FIG. 4B is a plan diagram of a substrate 45 having a plurality of patterns 40 for measurement actually used in measuring the conductive resistance.

The packages used in the experiments of conductive resistance were: the package having the mounting terminals with the bumps as shown in FIGS. 1A through 1C, and the packages having the ordinary mounting terminals as shown in FIGS. 3A through 3D. Because the experiments were conducted for the purpose of measuring the conductive resistance of the solder joining the mounting terminals to the land electrodes, the electrode pads in the package body, such as the two electrode pads 15 of FIG. 1A, were short-circuited. The conductive resistance was measured after each heat cycle test conducted at the following measurement points: prior to the heat cycle, 500 cycles, 1000 cycles, 1500 cycles, 2000 cycles, 2500 cycles, and 3000 cycles.

Figure 5:
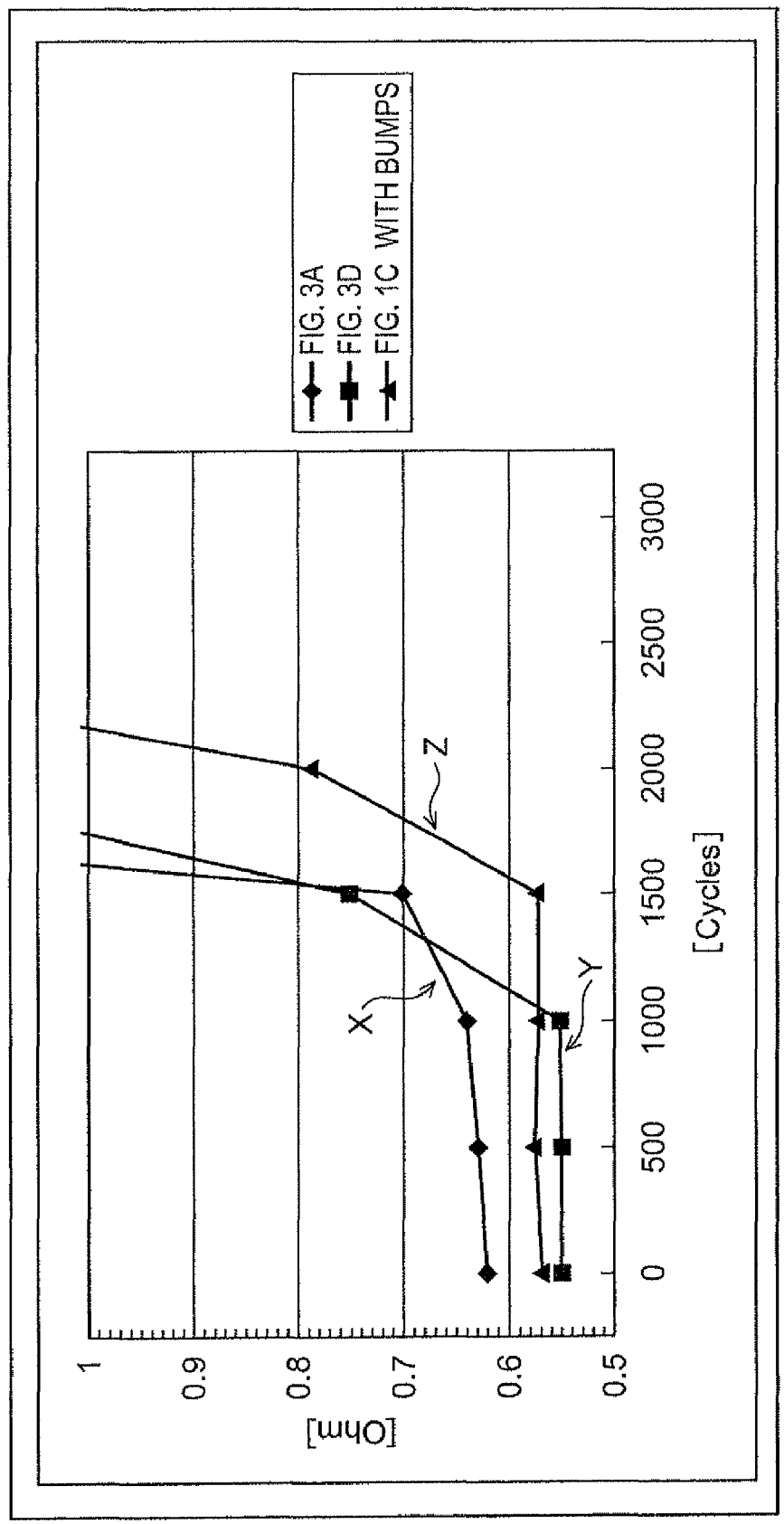
FIG. 5 is a graph showing the relationship between the number of heat cycles and the conductive resistance.

FIG. 5 is a line graph showing the conductive resistance obtained from each heat cycle test. Lines X, Y, Z indicate the relationships between the number of heat cycles and the conductive resistance of the packages having the mounting terminals of FIGS. 3A, 3D, 1C, respectively.

It was found from FIG. 5 that the package having the mounting terminals with the bumps according to the embodiment of the invention produced good results also in the heat cycle tests for the conductive resistance.

Figure 6:
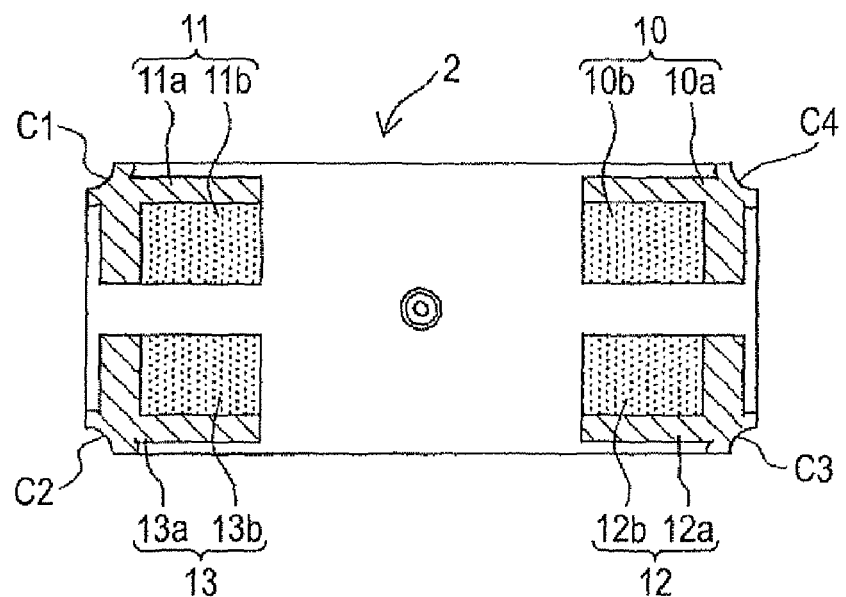
FIG. 6 is a bottom surface diagram of a package according to a second embodiment.

FIG. 6 is a bottom diagram showing the structure of a package 2 according to the second embodiment. The package 2 includes four mounting terminals 10, 11, 12, 13. The mounting terminals 10 to 13 are composed of mounting terminal bases 10a to 13a and bumps 10b to 13b, respectively. The mounting terminal bases 10a to 13a are disposed at four corners of the bottom surface of the package, each corner having each of the castellations C1 to C4. The bumps 10b to 13b are disposed at corners closer to the center of the package on the surface of the respective mounting terminal bases 10a to 13a. Such a positional relationship between the mounting terminal bases 10a to 13a and the bumps 10b to 13b allows thickening of the solder in the regions to which the maximum distortion is to be imparted.

Figure 7:
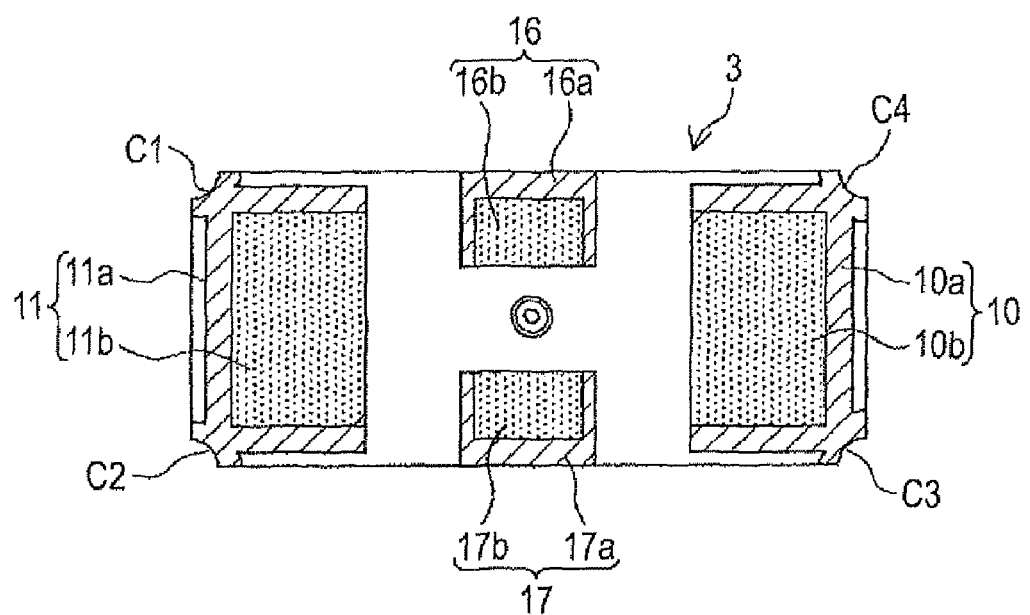
FIG. 7 is a bottom surface diagram of a package according to a third embodiment.

FIG. 7 is a bottom diagram showing the structure of a package 3 according to the third embodiment. The package 3 includes two mounting terminals 10, 11 and two dummy electrodes 16, 17. The mounting terminals 10, 11 are composed of mounting terminal bases 10a, 11a and bumps 10b, 11b, respectively. The bumps 10b, 11b are disposed against the mounting terminals 10a, 11a, similarly to the example of FIG. 1B. The dummy electrodes 16, 17 are provided on both sides in the longitudinal direction of the package 3, closer to edges in the width direction, and are composed of dummy electrode bases 16a, 17a and bumps 16b, 17b. The bumps 16b, 17b are provided on the surfaces of the dummy electrode bases 16a, 17a, closer to the center of the package 3. By providing the dummy electrodes 16, 17 having the bumps 16b, 17b, the connection strength between the package 3 and the circuit substrate increases.

Figure 8:
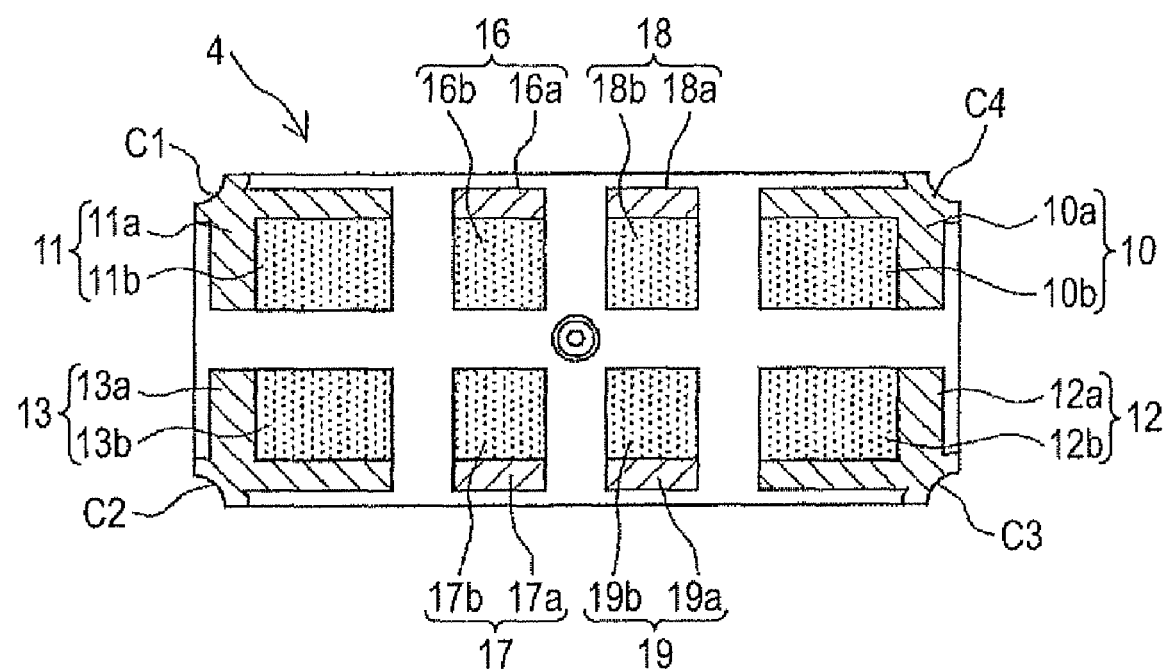
FIG. 8 is a bottom surface diagram of a package according to a fourth embodiment.
Figure 9A:
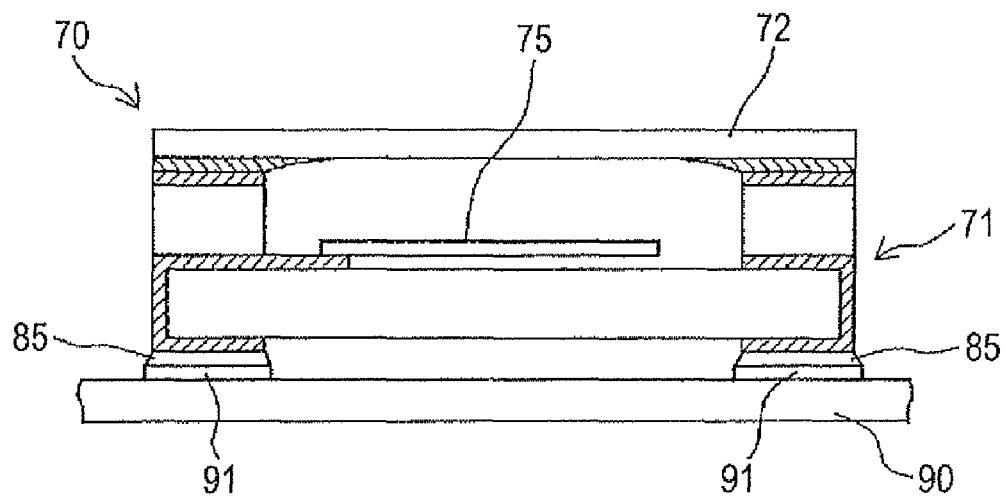
FIG. 9A is a sectional diagram of a package of a related art.
Figure 9B:
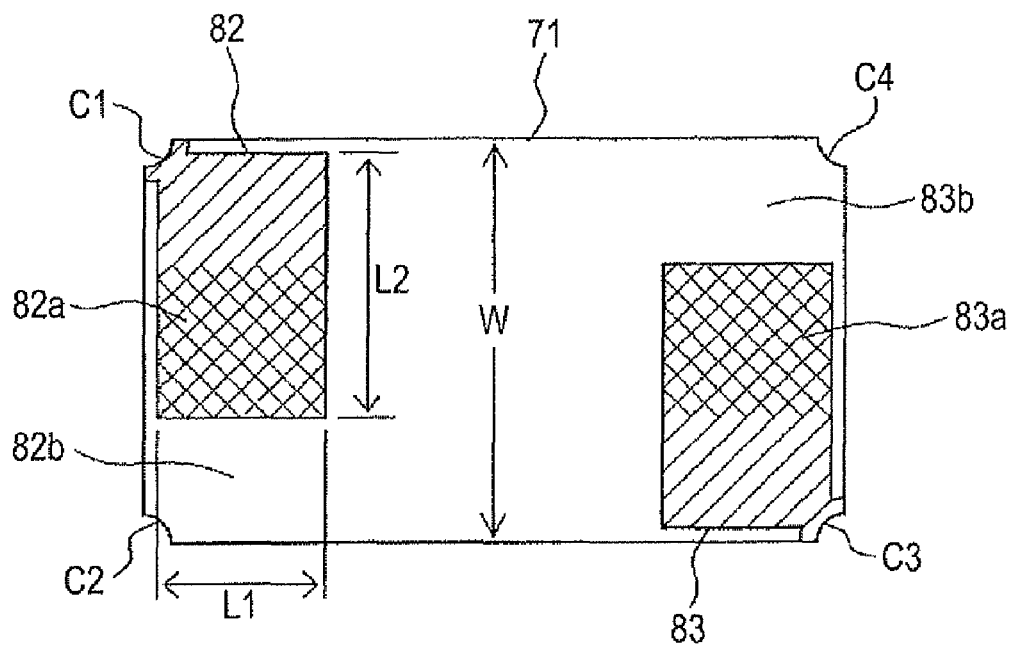
FIG. 9B is a bottom surface diagram of the package of FIG. 9A.

FIG. 8 is a bottom diagram showing the structure of a package 4 according to the fourth embodiment. The package 4 includes four dummy electrodes 16, 17, 18, 19 on both sides in the longitudinal direction of the package 2 of the second embodiment shown in FIG. 6. The dummy terminals 16 to 19 are composed of mounting terminal bases 16a, 17a, 18a, 19a and bumps 16b, 17b, 18b, 18b, respectively. The bumps 16b to 19b are provided on the surfaces of the dummy electrode bases 16a to 19a, closer to the center of the package 4. By providing the package with the dummy electrodes 16 through 19, the connection strength between the package and the circuit substrate increases further.

The first embodiment with reference to FIGS. 1A through 1C is the example in which the tuning fork type quartz crystal resonator element is mounted on the electrode pads 15 formed in the recess of the package 1. However, it is possible to mount piezoelectric elements to the packages 2, 3, 4 of the second to fourth embodiments as shown in FIGS. 6, 7, 8 so as to produce surface-mount piezoelectric resonators.

The package according to the embodiment of the invention differs from the package of JP-A-2006-186667 having the projection on the terminal electrode, in that the present mounting terminals are structured such that the solder is thickened at regions of each mounting terminal where large distortion is generated, namely, regions far from the center of the package and regions at the periphery of each mounting terminal excluding near the center of the package.

The entire disclosure of Japanese Patent Application No. 2008-252604, filed Apr. Sep. 9, 2008 is expressly incorporated by reference herein.

What is claimed is:

1. A package for electronic component, comprising:
    a rectangular package body;
    a lid hermetically sealing the package body;
    an electrode pad provided in the package body;
    a mounting terminal provided at least near a corner of a mounting surface of the package body and having a raised portion on the mounting surface, a thickness of the raised portion being greater than a thickness of the mounting terminal; and
    a coupling electrodes electrically coupling the pad to the mounting terminal.

2. The package for electronic component according to claim 1, further comprising a castellation at the corner of the package body, the coupling electrodes being provided to the castellation.

3. The package for electronic component according to claim 1, wherein, if the mounting terminal is joined to a circuit substrate with solder, the raised portion on the mounting terminal has such a shape that the solder is thickened at a periphery of the corner.

4. The package for electronic component according to claim 1, further comprising a pair of dummy electrodes provided to the package.

5. The package for electronic component according to claim 4, further comprising more than one pair of dummy electrodes.

6. A piezoelectric resonator, comprising:
    the package for electronic component according to claim 1; and
    a piezoelectric resonator element mounted on the electrode pad of the package body.

7. The package for electronic component according to claim 1, wherein
    a length and a width of the mounting terminal are greater than a length and a width of the raised portion.

* * * * *